United States Patent [19]

Cetronio et al.

[11] Patent Number: 4,818,724

[45] Date of Patent: Apr. 4, 1989

[54] PHOTOLITHOGRAPHIC METHOD OF ALIGNING A STRUCTURE ON THE BACK OF A SUBSTRATE

[75] Inventors: Antonio Cetronio; Sergio Moretti, both of Rome; Maurizio Di Bona, Alvito, all of Italy

[73] Assignee: Selenia Industrie Elettroniche Associate S.P.A., Rome, Italy

[21] Appl. No.: 68,645

[22] Filed: Jun. 30, 1987

[30] Foreign Application Priority Data

Jun. 30, 1986 [IT] Italy .................. 48205 A/86

[51] Int. Cl.⁴ ........................................... H01L 21/30
[52] U.S. Cl. ...................................... 437/203; 437/90;
437/183; 437/249; 437/924; 437/948; 437/86;
156/656; 156/659.1; 357/55; 357/68;
148/DIG. 102
[58] Field of Search ............... 148/DIG. 102; 357/55,
357/68; 156/656, 659.1; 437/90, 183, 249, 924,
948, 86

[56] References Cited

U.S. PATENT DOCUMENTS

| | | | |
|---|---|---|---|
| 3,787,252 | 1/1974 | Filippazzi et al. | 357/68 |
| 3,984,680 | 10/1976 | Smith | 437/924 |
| 3,986,196 | 10/1976 | Decker et al. | 357/55 |
| 4,104,099 | 8/1978 | Scherrer | 156/306.6 |
| 4,309,813 | 1/1982 | Hull | 156/659.1 |
| 4,348,253 | 9/1982 | Subbarao et al. | 156/656 |
| 4,374,915 | 2/1983 | Ahlquist et al. | 156/644 |
| 4,669,175 | 6/1987 | Ray | 156/656 |
| 4,727,047 | 2/1988 | Bozler et al. | 437/86 |

FOREIGN PATENT DOCUMENTS

| | | | |
|---|---|---|---|
| 0060565 | 5/1977 | Japan | 437/924 |
| 0054379 | 5/1977 | Japan | 437/924 |
| 0224226 | 11/1985 | Japan . | |

Primary Examiner—Brian E. Hearn
Assistant Examiner—Beverly A. Pawlikowski
Attorney, Agent, or Firm—Herbert Dubno

[57] ABSTRACT

A method of making semiconductive developments, especially MESFETs, which applies a template to a surface of the substrate previously formed with circuit elements in alignment with these elements and so bonds the template to the substrate that the template can be utilized as a holder for the substrate. The rear surface is then coated with a resist and a second template aligned externally with the first utilizing markings exterior to the substrate to form the structure on the rear surface which can include throughholes for a metal deposit extending through the preferably GaAs substrate.

8 Claims, 4 Drawing Sheets

PHOTOLITHOGRAPHIC METHOD OF ALIGNING A STRUCTURE ON THE BACK OF A SUBSTRATE

FIELD OF THE INVENTION

Our present invention relates to a photolithographic method of aligning a structure on the back of a substrate with elements on the front surface of a substrate, e.g. in the production of electronic devices and, particularly, MESFETs with high registration or recording accuracy. The invention especially involves a technique for the alignment through conventional photolithography of a structure on the back of a sample (with circuit elements on the front face thereof with high recording accuracy).

BACKGROUND OF THE INVENTION

In the production of circuit elements, it is known to utilize photolithography to build-up structures on the surfaces of a substrate, hereinafter also referred to as a sample, utilizing the application of a photoresist or photopolymer which, upon exposure through a mask or template, can be developed to leave an opening, passage or window through which a deposit can be formed on the substrate or a surface treatment can be undertaken upon the substrate as thus revealed.

In such devices, for example MESFETs, volume characteristics of the material can be used and at times there is a need to align on the back of the sample or substrate structures with the circuit elements on the front of the sample or substrate with considerable recording accuracy. It is possible, utilizing conventional photolithography, to provide structures having circuit elements on both the rear and front surfaces of a substrate which are aligned with accuracies of the order of ±1 micrometer.

OBJECTS OF THE INVENTION

It is the principal object of the present invention to provide an improved method of aligning structures on the rear of a sample or substrate with structures previously formed on a front surface thereof so that, particularly in the fabrication of circuit elements, a high recording accuracy is achieved.

An object of this invention is to provide an improved method of making semiconductor devices utilizing the volume or bulk cross-section characteristics of the substrate so that circuit elements can be applied on both major surfaces of the substrate with a high degree of registration or recording accuracy.

It is a more specific object of our invention to provide an improved method of making MESFETs and like circuit elements utilizing GaAs substrates which allows for the application of conductors on a rear surface of the substrate in precise alignment with the circuit elements upon a front surface thereof.

SUMMARY OF THE INVENTION

These objects and others which will become apparent hereinafter are attained, in accordance with the present invention, by a method in which a template which can be easily aligned with preformed circuit elements on the front surface of a substrate is bonded to the front surface of the substrate temporarily to form a support by which the substrate is held while operations are carried out on the rear surface, utilizing alignment of a rear-surface template utilizing conventional photolithographic techniques.

After these operations are completed, the template which has served as a support, is removed and the finished front-surface circuit elements are again exposed.

Thus a stencil or a template is used as a support for the substrate and provides for alignment and bonding of the substrate to the support and for the alignment of any template utilized for location of structures on the rear of the substrate utilizing a marking formed by the first template on a portion thereof extending laterally of the substrate. The marking, of course, can be a pattern on that first template or some other formation thereon, such as the edge of the template.

The visible references, therefore, on the two templates beyond the substrate allows conventional photolithographic equipment and machinery to be employed for this alignment by conventional photolithographic principles.

The invention may be used particularly to obtain holes which extend completely through the substrate between the rear and front surfaces and can connect circuit elements on opposite faces of the substrate upon the deposition of a suitable metal in the holes, such holes can be referred to herein as throughholes or via-holes and can be provided in a GaAs structure to ground sources of power MESFETs through the thickness of a material.

Thus, in other terms, the method of the invention comprises the steps of:

(a) forming at least in part by photolithography on one face of an etchable electronic-device substrate, electronic circuit elements adapted to be part of the electronic device;

(b) aligning with the one face a first template having indicia associated with the elements thereon and at least one marking on a portion of the first template projecting laterally of the substrate;

(c) bonding the first template to the one face upon alignment of the indicia with the elements;

(d) while supporting the substrate by the first template, subjecting another face of the substrate opposite to the one face to photolithographic treatment using the marking to align the photolithographic treatment with the elements and the substrate; and (e) thereafter removing the first template from the one face following the photolithographic treatment.

Advantageously, the photolithographic treatment comprises the steps of:

(f) applying a photoresist to the other face;

(g) aligning a second template carrying a pattern of at least one circuit element to be applied to the other face with the substrate and the circuit elements on the one face with the marking on the first template;

(h) photolithographically exposing the photoresist through the second template and developing the photoresist; and (i) forming the circuit element to be applied to the other face on the other face based upon the developed photoresist.

The pattern can include a pattern of throughholes adapted to traverse the substrate, the method further comprising the steps of:

(j) etching the substrate through the thickness thereof in accordance with the pattern to form the throughholes; and (k) depositing metal on the other face and in the throughholes.

The method can have the bonding of the first template in step (c) effected by:

(c₁) spreading a high-viscosity resist on a chromium-plated surface of the first template;

(c₂) spreading a further resist of lesser viscosity than the high-viscosity resist on the one face of the substrate bearing the circuit elements formed in step (a);

(c₃) pressing the first template against the substrate so that the high-viscosity resist and the further resist are in maintained in contact for a period of time enabling the substrate to bond to the first template by bonding characteristics of the of the high-viscosity and the further resist; and (c₄) baking the bonded first template and substrate at about 90° C. for about 1 hour to stabilize the bond formed by the first template and the substrate.

Advantageously, the photoresist is a resist of lesser viscosity than that of the high-viscosity resist, the photoresist being baked at about 90° C. after application in step (f) for about 30 minutes and the marking of the first template used to align the second template are formed by a border of the first template projecting beyond the substrate.

The method can further comprise the step of: (m) thinning the substrate while supporting the substrate with the first template before applying the photoresist to the other face in step (f). The thinning in step (m) can be carried out by mechanical or chemical (etching) material removal.

Advantageously, the method also comprises the step of:

(n) reusing the template removed in step (e) by bonding to another substrate.

BRIEF DESCRIPTION OF THE DRAWING

The above objects, features and advantages of our invention will become more readily apparent from the following description, reference being made to the accompanying highly diagrammatic drawing in which.

SPECIFIC DESCRIPTION

Figure 1:
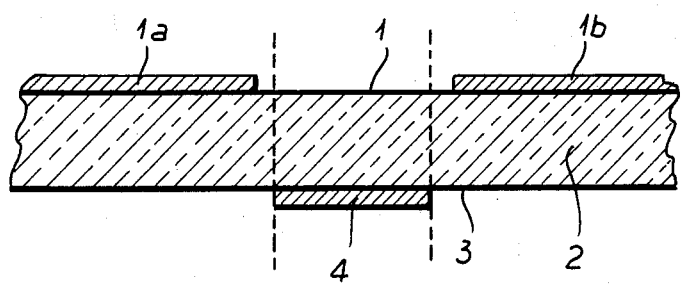
FIG. 1 is a diagrammatic cross-sectional view of a MESFET showing circuit elements on front and rear faces thereof which can be utilized in the practice of the invention or can be made through the practice of the invention.

In FIG. 1, we have shown in highly diagrammatic form, basic elements of a MESFET including a GaAs substrate 2 having a front surface 1 which may be preformed with circuit elements 1a and 1b which represents merely the circuit elements which may be provided on the surface such as source pads, drain structures or gates of the power MESFET.

On the rear surface 3, utilizing photolithographic techniques like those used to apply the source pads, a rear structure can be provided. This rear structure is represented at 4 and may be tooling or other structure on the rear surface 3.

Figure 2:
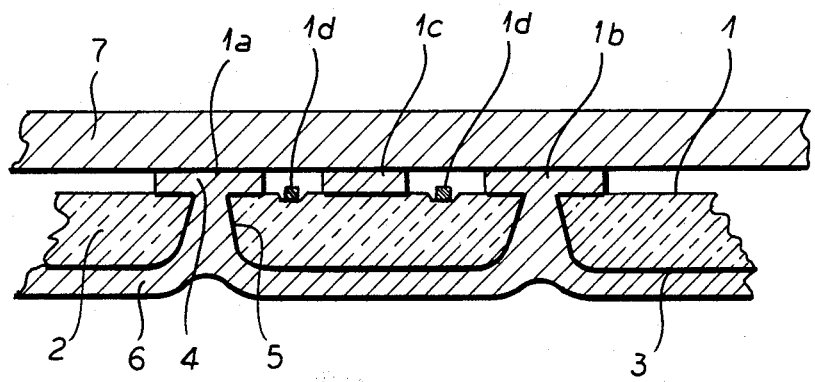
FIG. 2 is a section through a power MESFET illustrating the throughholes or via-holes formed in accordance with the invention.

Turning to FIG. 2 from which one of the principles of the invention can be immediately apparent, it is possible to see the first stencil or template 7 which is bonded to the front surface and is utilized as a support or holder for the latter. This template will ultimately be removed.

In this FIGURE, moreover, the source pads 1a and 1b are shown to be separated from the drain 1c and the gates 1d of the power MESFETs while the substrate is shown to be formed with throughholes or via-holes filled with metal 6 which can be utilized to ground the source pads to one another and in this embodiment, forms the structure on the rear of the substrate 2. The holes 5 are formed in the substrate 2 also from the rear.

Figure 3A:
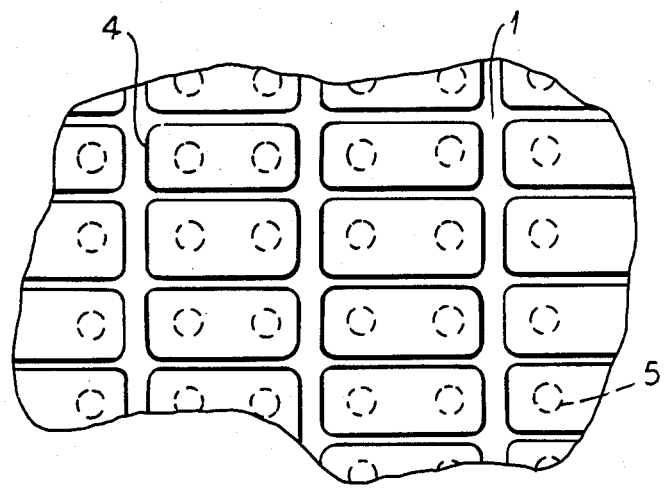
FIG. 3a is an elevational view showing the tooled front surfaces of the sample.
Figure 3B:
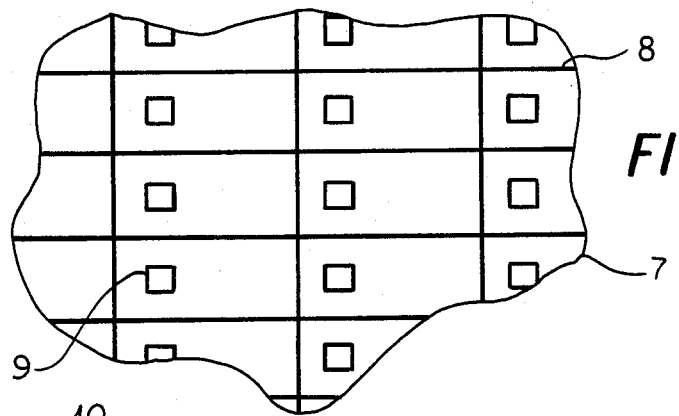
FIG. 3b shows the surface of the stencil or first template onto which the front surface is to be bonded.
Figure 3C:
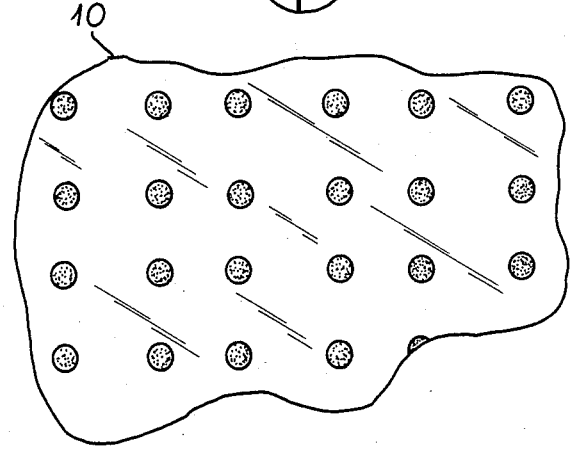
FIG. 3c shows the template utilized to obtain the structure on the rear of the semiconductive substrate.

FIG. 3a shows the front surface of the substrate previously provided with source pads in a respective array of MESFETS, simply shown as rectangular blocks but illustrated also are the locations at which the holes 5 must ultimately penetrate below the source pads. The support template 7 is provided with a pattern structure here shown as including square openings or windows 9 in a corresponding rectangular array and in FIG. 3c, the rear template 10 which is opaque where the holes are to be formed can be seen.

Referring now to FIGS. 4a through 4d, one can see that the template 7 can be applied to the substrate 2 in proper registry with the preformed circuit elements thereon.

Then a bonding is effected so that the template 7 functions as a holder. The substrate 2 can then be supported with its rear surface exposed.

Figure 4A:
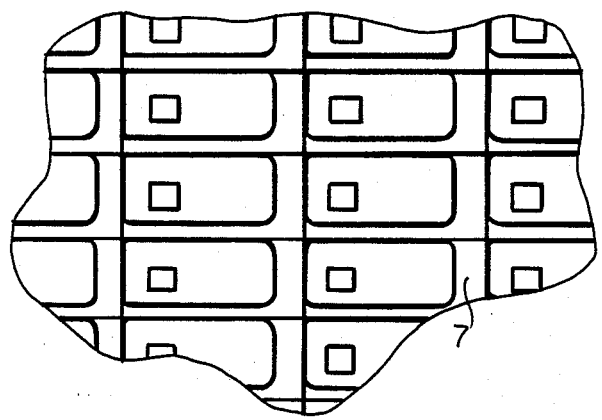
FIGS. 4a and 4b show the template/sample structure prepared for alignment of a rear template in a plan view and cross section.
Figure 4B:
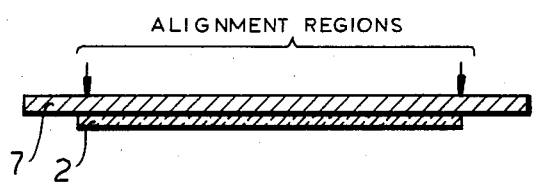
Figure 4C:
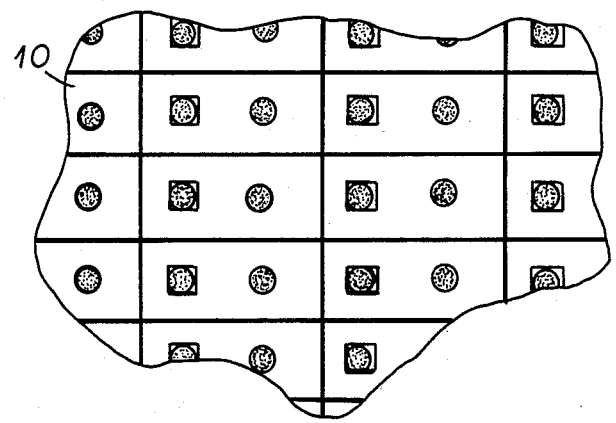
FIGS. 4c and 4d are similar views showing the rear template after it has been applied there.
Figure 4D:
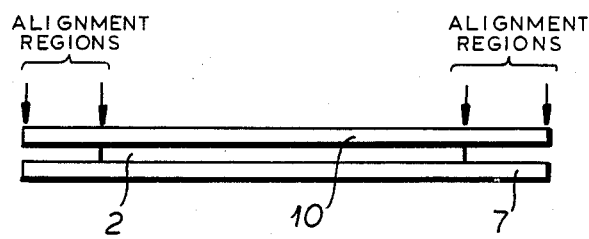

After application of a photoresist (see FIG. 5 and the more specific description of it below) the template 10 is aligned with the template 7 without the need to direct infrared radiation through the substrate utilizing markings on the two templates projecting beyond the substrate, i.e. in the alignment regions illustrated in FIG. 4d so that conventional photoalignment systems common in photolithography can be used.

After exposure and development, of course, operations can be effected on the rear surface while it is supported by the template 7.

The substrate can be eroded to produce the throughholes and a metal 6 can be deposited therein.

prior to the application of the resist and the use of the second template, the substrate can be mechanically thinned, e.g. by milling, or reduced in thickness chemically.

A thinning of the substrate can be utilized to achieve good thermal impedance and the desired electrical response of the substrate.

One of the main advantages of the present invention is that it does not require special equipment and can utilize a conventional aligner well known in the photolithographic production of semiconductor chips for electronic circuitry. Certainly, infrared systems are not necessary.

Indeed, these work on the principle that many semiconductors are transparent to infrared wave lengths so that it is possible to see through the material during alignment of the rear structure. Obviously, by comparison with the infrared systems, the technique of the invention has the advantage that it is applicable to any type of structure and is largely independent of substrate thickness.

With the present invention, the first template is applied utilizing conventional photolithographic alignment (FIG. 3a) and for that purpose, the template 7 may be supplementary to any template required by IR. This template which also serves as the sample carrier during milling (FIG. 3b) includes two basic references or indicia, namely, the rectangular gear structure 8 which should be capable of framing the sources 4 of the devices perfectly and a square structure 9 at the throughhole pitch for producing the throughholes and the second stencil or template 10 with the throughhole pitch.

Figure 5:
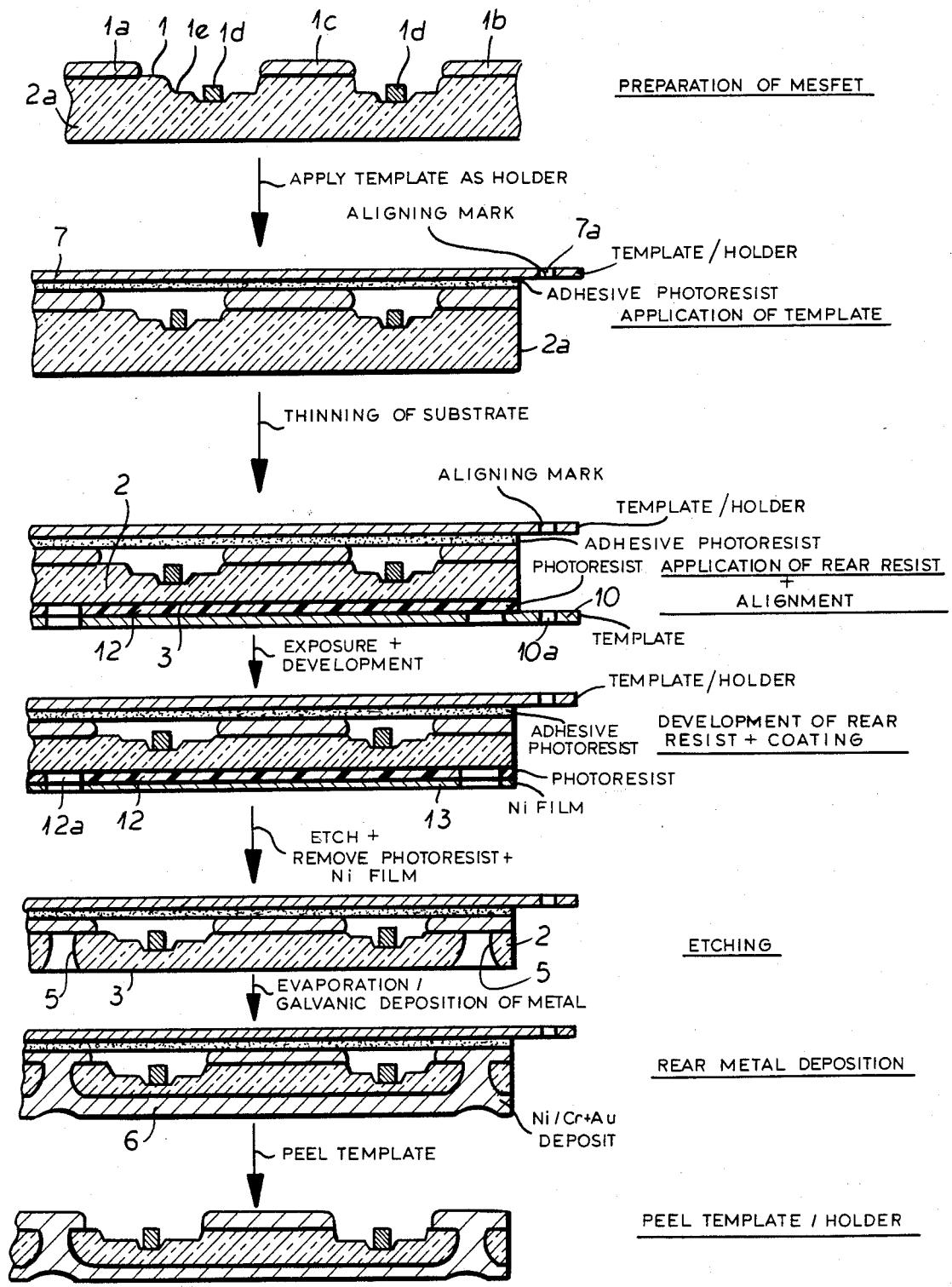
FIG. 5 is a diagram of the steps involved in the process of the invention.

Referring now to FIG. 5, where the production of a MESFET circuit has been illustrated, one can see a GaAs substrate 2a which may have previously been formed at its upper surface 1 with sources 1a and 1b, a drain 1c and gates 1d by photolithography, the gates being provided in a double-recess structure 1e fabricated by the technique described in the concurrently filed, commonly-owned copending application Ser. No. 069730 6-30-87 corresponding to Italian Application No. 48206 A/86 filed 30 June 1986.

According to the invention, we spread a high viscosity resist on the chromium-plated underside of the template 7 containing the reference markings for the circuit elements 1a, 1b, etc. and for alignment. The aligning mark only has been shown at 7a in FIG. 5. This aligning mark, of course, represents the proposed positioning of the template for the throughholes and thus the locations of the throughholes.

A predetermined viscosity resist is spread on the front face 1 of the GaAs substrate 2a equipped with the MESFET circuit elements.

The template 7 is then aligned with the substrate 2 so that the edges of the circuit elements on the front face match the rectangular pattern structure 8 of the template 7 utilizing a conventional aligner (FIG. 4a).

Once aligned, the template 7 and the substrate 2a are pressed into hard contact for about 30 seconds. This exploits the bonding characteristics of the unbaked resists.

The resulting assembly is then baked at 90° C. preferably for about one hour to stabilize bonding.

As the next stage in FIG. 5 shows, the substrate 2a can be thinned, e.g. by milling to form the substrate 2 of appropriate thickness as previously described. If thinning is not required, this step may be skipped.

With template 7 acting as a carrier of the assembly 2,7, previously aligned, a medium viscosity resist 2 is spread on the rear 3 of the substrate and the resulting assembly is baked at 90° C. for about 30 minutes.

The template 10 is then aligned with the assembly utilizing the areas external to the substrate as a guide, e.g. the marking 10a as shown in FIG. 5.

Once the alignment has been performed (see FIG. 4b) the resist 12 is exposed for a predetermined time of the order of a few seconds and the areas exposed are developed.

This leaves windows 12a in the resist layer 12, which is then coated with a nickel film having a thickness of 2000 angstroms to form a pattern or mask through which etching can be effected.

The nickel film has been shown at 13 in FIG. 5. As the next step in FIG. 5 illustrates, the GaAs substrate is eroded with reactive plasma through the windows 12a to form the throughholes 5.

Onto the rear surface 3 of the substrate 2 and in the throughholes, a nickel/chromium film with a thickness of 300 to 2000 angstroms is deposited by evaporation and onto this coating a 300 to 2000 angstrom film of gold is evaporated. To form the balance of the metal deposit 6, gold is directed to a thickness of 5 micrometers on the surface 6, substantially filling the throughholes 5.

As is apparent from the last step shown in FIG. 5, the substrate 2 is then peeled from the template 7 by wetting the assembly with hot acetone.

The invention, therefore, utilizes conventional photolithography to align with high accuracy a predetermined structure on the rear of a sample taking as reference the circuit elements produced on the front. The technique utilizes a template with respect to which the substrate is aligned and to which the substrate is bonded, this template being later utilized as a holder for treatment of the rear surface and to align a predetermined structure on the rear of the substrate. Via-holes can be aligned with high accuracy in perfect correspondence with the sources of power MESFET devices.

Compared to previously available systems which utilize an IR detector and source to see through the substrate, this method does not require such special equipment and any type of substrate including silicon, germanium, composite semiconductors, quartz, glass and metal, can be used.

We claim:
1. A method of making an electronic device which comprises the steps of:
   (a) forming at least in part by photolithography on one face of an etchable electronic-device substrate electronic circuit elements adapted to be part of said electronic device;
   (b) aligning with said one face a first template having indicia associated with said elements and at least one marking on a portion of said first template projecting laterally of said substrate;
   (c) bonding said first template to said one face upon alignment of said indicia with said elements;
   (d) while supporting said substrate by said first template, effecting a photolithographic treatment of an opposite face of said substrate consisting essentially of:
   ($d_1$) applying a photoresist to said opposite face,
   ($d_2$) aligning a second template carrying a pattern of throughholes to be applied from said opposite face through said substrate with said substrate and the circuit elements on said one face by photoalignment of a marking on a portion of said second template projecting laterally of said substrate with said marking on said first template,
   ($d_3$) photolithographically exposing said photoresist through said second template, removing said second template, and developing said photoresist to form apertures in said photoresist in a pattern of said throughholes,
   ($d_4$) etching said substrate through the thickness thereof in accordance with said pattern to form said throughholes,
   ($d_5$) depositing metal on said opposite face and in said throughholes into conductive contact with said circuit elements on said one face of said substrate; and
   (e) thereafter removing said first template from said one face following said photolithographic treatment.

2. A method of making an electronic device which comprises the steps of:
   (a) forming at least in part by photolithography on one face of an etchable electronic-device substrate electronic circuit elements adapted to be part of said electronic device;
   (b) aligning with said one face a first template having indicia associated with said elements and at least one marking on a portion of said first template projecting laterally of said substrate;
   (c) bonding said first template to said one face upon alignment of said indicia with said elements;
   (d) while supporting said substrate by said first template, effecting a photolithographic treatment of an opposite face of said substrate consisting essentially of:
      ($d_1$) applying a photoresist to said opposite face,
      ($d_2$) aligning a second template carrying a pattern of throughholes to be applied from said opposite face through said substrate with said substrate and the circuit elements on said one face by photoalignment of a marking on a portion of said second template projecting laterally of said substrate with said marking on said first template,
      ($d_3$) photolithographically exposing said photoresist through said second template, removing said second template, and developing said photoresist to form apertures in said photoresist in a pattern of said throughholes,
      ($d_4$) etching said substrate through the thickness thereof in accordance with said pattern to form said throughholes,
      ($d_5$) depositing metal on said opposite face and in said throughholes into conductive contact with said circuit elements on said one face of said substrate; and
   (e) thereafter removing said first template from said one face following said photolithographic treatment. bonding of said first template in step (c) being effected by:
      ($c_1$) spreading a high-viscosity resist on a chromium-plated surface of said first template;
      ($c_2$) spreading a further resist of lesser iscosity than the high-viscosity resist on said one face of said substrate bearing the circuit elements formed in step (a);
      ($c_3$) pressing said first template against said substrate so that said high-viscosity resist and said further resist are in maintained in contact for a period of time enabling said substrate to bond to said first template by bonding characteristics of said of said high-viscosity and said further resist; and
      ($c_4$) baking the bonded first template and substrate at about 90° C. for about 1 hour to stabilize the bond formed by the first template and said substrate.

3. The method defined in claim 2 wherein said photoresist is a resist of lesser viscosity than that of said high-viscosity resist, said photoresist being baked at about 90° C. after application in step ($d_1$) for about 30 minutes and the marking of said first template used to align said second template are formed by a border of said first template projecting beyond said substrate.

4. The method defined in claim 3, further comprising the step of:
   (f) thinning said substrate while supporting said substrate with said first template before applying said photoresist to said other face in step ($d_1$).

5. The method defined in claim 4 wherein the thinning in step (f) is carried out by mechanical material removal.

6. The method defined in claim 4 wherein the thinning in step (f) is carried out by chemical etching material removal.

7. The method defined in claim 2, further comprising the step of:
   reusing the template removed in step (e) by bonding it to another substrate.

8. The method defined in claim 2 wherein said substrate is GaAs.

* * * * *